United States Patent [19]
Christin

[11] Patent Number: 5,846,611
[45] Date of Patent: Dec. 8, 1998

[54] CHEMICAL VAPOR INFILTRATION PROCESS OF A MATERIAL WITHIN A FIBROUS SUBSTRATE WITH CREATION OF A TEMPERATURE GRADIENT IN THE LATTER

[75] Inventor: François Christin, Saint Aubin de Medoc, France

[73] Assignee: Societe Europeene de Propulsion, Suresnes, France

[21] Appl. No.: 953,798

[22] Filed: Oct. 16, 1997

Related U.S. Application Data

[63] Continuation of Ser. No. 632,495, filed as PCT/FR94/01075 Sep. 14, 1994 published as WO95/11869 May 4, 1995, abandoned.

[30] Foreign Application Priority Data

Oct. 27, 1993 [FR] France ................................. 93 12805

[51] Int. Cl.$^6$ .................................................. C23C 16/26
[52] U.S. Cl. ........................ 427/543; 427/547; 427/228; 427/249; 427/590; 427/591; 427/595
[58] Field of Search ................... 427/543, 547, 427/228, 249, 590, 591, 595

[56] References Cited

U.S. PATENT DOCUMENTS

| | | | |
|---|---|---|---|
| 4,790,052 | 12/1988 | Olry | 28/110 |
| 5,348,774 | 9/1994 | Golecki et al. | 427/543 |

FOREIGN PATENT DOCUMENTS

| | | |
|---|---|---|
| 2427197 | 12/1979 | France . |
| 2670507 | 6/1992 | France . |
| 2177345 | 1/1987 | United Kingdom . |
| 2177431 | 1/1987 | United Kingdom . |
| WO8704733 | 8/1987 | WIPO . |

OTHER PUBLICATIONS

"Infiltration of Porous Substrates", W.V. Kotlensky, 16th National Sample Symposium, Apr. 21, 1971, Anaheim, CA, U.S.A., pp. 257–265.13.

"Formation of Carbon–Carbon Composite Materials by Prolytic Infiltration", J.J. Gebhardt, et al., ACS Symposium Series, vol. 21, 1976, Washington, D.C., pp. 212–227. (no month).

*Primary Examiner*—Shrive Beck
*Assistant Examiner*—Timothy Meeks
*Attorney, Agent, or Firm*—Weingarten, Schurgin, Gagnebin & Hayes LLP

[57] ABSTRACT

The substrate (30) is placed in an enclosure (34) and is heated by direct electromagnetic coupling with an induction winding (38) to enable a temperature gradient to be established within the substrate, so that the substrate has a higher temperature in its portions remote from its exposed surfaces than in the vicinity of its exposed surfaces. A reaction gas constituting a precursor for the material to be infiltrated is admitted into the enclosure, with the formation of the material being favored in those portions of the substrate that are at higher temperature. According to the invention, the substrate is constituted by a fibrous fabric for which the ratio $\rho_r/\rho_c$ of transversal electrical resistivity over longitudinal electrical resistivity is not less than 1.3, and the ratio $\lambda_r/\lambda_c$ of transversal thermal conductivity over longitudinal conductivity is not less than 0.9, and the substrate is situated entirely within the field produced by the induction winding, the substrate and the induction winding occupying positions that are fixed relative to each other. Advantageously, the substrate is constituted by a needled fibrous structure in which the volume ratio of the fibers is not less than 20%.

7 Claims, 2 Drawing Sheets

CHEMICAL VAPOR INFILTRATION PROCESS OF A MATERIAL WITHIN A FIBROUS SUBSTRATE WITH CREATION OF A TEMPERATURE GRADIENT IN THE LATTER

RELATED APPLICATION

This application is a file wrapper continuation, under 37 C.F.R. 1.62, of U.S. patent application Ser. No. 08/632,495, filed as PCT/FR94/01075 sep. 14, 1994 published as WO95/11869 May 4, 1995, now abandoned, entitled: CHEMICAL VAPOUR INFILTRATION PROCESS OF A MATERIAL WITHIN A FIBROUS SUBSTRATE WITH CREATION OF A TEMPERATURE GRADIENT IN THE LATTER.

BACKGROUND OF THE INVENTION

1. Field of the Invention

The present invention relates to a chemical vapor infiltration (CVI) method of infiltrating a material into a fibrous substrate.

2. Description of the Related Art

The field of application of the invention is in particular that of manufacturing pieces made of composite material comprising a fibrous substrate or "preform" that has been densified by a matrix. In this application, chemical vapor infiltration is used to form a deposit of the matrix-constituting material on the fibers of the substrate and throughout the volume thereof, in order to bond the fibers together and fill in the pores initially accessible in the substrate. Chemical vapor infiltration may also be used to finish off densification performed in part by some other method, e.g. using a liquid process in which the substrate is impregnated with a liquid precursor for the matrix-constituting material, and then the precursor is transformed, generally by heat treatment.

To perform chemical vapor infiltration, the fibrous substrate is placed in an enclosure. A reaction gas is admitted into the enclosure. Under determined conditions of temperature and pressure, the gas diffuses within the substrate and forms the deposit of matrix material by means of the components of the gas decomposing or reacting on making contact with the fibers.

The composition of the gas is selected as a function of the matrix to be made. CVI methods are well known for forming matrices out of pyrolytic carbon or "pyrocarbon", or out of ceramic, e.g. silicon carbide, boron nitride, or refractory oxides.

Several types of CVI method are in existence: the constant temperature and pressure method, the pressure gradient method, and the temperature gradient method.

In the constant temperature and pressure method, the substrate to be densified is placed in an isothermal enclosure. Heating is provided, e.g. by means of a graphite susceptor or core surrounding the enclosure and itself surrounded by an induction winding. Energy is applied to the substrate essentially by radiation from the enclosure. The temperature inside the enclosure is regulated to the desired value by controlling the current in the winding, while the pressure is adjusted by connecting the enclosure to a vacuum source and controlling the rate at which the gas is admitted into the enclosure. Matrix material is deposited inside the substrate and on the surface thereof. The temperature and pressure are selected to have values that are only slightly greater than those required for a deposit to form, so as to avoid massive deposition on the surface of the substrate occurring immediately on contact with the gas, since that would quickly lead to the surface pores being shut off, thereby preventing densification taking place within the substrate.

Nevertheless, it is inevitable that the surface pores will be closed progressively, thereby stopping the densification process before it is complete within the core of the substrate. It is then necessary to remove surface crust by machining so as to reopen the array of pores and continue densification. Several intermediate crust-removal operations may be necessary on a single piece prior to achieving the desired degree of densification.

By accurately controlling infiltration conditions, that method makes it possible to obtain a matrix of desired quality, and to do so in reproducible manner. It also has the major advantage of enabling a plurality of pieces of various shapes to be densified simultaneously within the same enclosure.

In spite of these advantages which justify its use on an industrial scale, the constant temperature and pressure method suffers from drawbacks of lengthy duration and large cost, in particular when manufacturing composite pieces of great thickness. Densification requires deposition to take place slowly, and thus requires cycles of long duration. In addition, the intermediate machining operations for crust removal give rise to losses of material and contribute to increasing cost price, with alternation between infiltration and crust removal lengthening the total duration of manufacture and increasing its cost. Finally, in particular for pieces of great thickness, it is inevitable that a considerable densification gradient remains within a given piece, with the degree of densification being significantly less deep within the piece than at its surface.

The pressure gradient method uses a forced flow of the gas through the preform. The forced flow gives rise to a pressure difference across the piece.

In addition to requiring the gas transport system to be specially adapted, the pressure gradient method suffers from one of the same limitations as the constant temperature and pressure method. The permeability of the pores to the gas decreases rapidly with more deposit being formed on the side facing the gas inlet. It is necessary to remove crust therefrom periodically in order to enable densification to continue.

In addition, that method is applicable only to substrates of shapes that are particularly simple and limited, with each piece requiring a special gas feed and circulation device.

The temperature gradient method consists in performing non-uniform heating of the substrate so that its temperature in the vicinity of its exposed surface is lower than its inside temperature remote from the surface. Since the deposition reaction is thermally activated, deposition speed or matrix growth increases with temperature. As a result, more densification takes place in the hotter portions within the substrate than in the cooler portions at the exposed surface of the substrate. This prevents a greater deposit being formed at the surface with premature shutting of the pores, and thus prevents the need for intermediate operations. This is the type of infiltration method to which the present invention relates.

A CVI device using a temperature gradient was presented and described by W. V. Kotlensky to the "16th National SAMPE Symposium, Anaheim, Calif., Apr. 21–23, 1971" under the title "A review of CVD carbon infiltration of porous substrates" and in a work entitled "Chemistry and physics of carbon", published in the United States of America by P. L. Walker, Vol. 9, pp. 198–199. That device is shown very diagrammatically in FIG. 1.

The substrate 10 to be densified is applied via an inside face 10a against a graphite core 12. The substrate 10 and the core 12 are received inside an enclosure 14 defined by a quartz tube 16. A water-cooled induction winding 18 surrounds the tube 16. Gas is admitted via the base of the tube 16 and it flows upwards.

The core 12 is heated by electromagnetic coupling with the winding 18 and it in turn heats the substrate 10 with which it is in contact. The substrate 10 is a carbon fiber felt which is not directly heated by induction because of its low density and poor electromagnetic coupling with the winding. In addition, its low thermal conductivity means that in this configuration temperature gradients of several hundreds of °C. are observed.

That technique suffers from several drawbacks. In particular, only substrates of relatively small thickness can be densified thereby in satisfactory manner. Also, the efficiency with which the preform is heated is strongly dependent on the quality of its contact with the core.

The above, in association with the existence of temperature differences of several hundreds of °C., makes it difficult to control deposition conditions sufficiently accurately to guarantee that a matrix is formed which has the desired characteristics exactly.

Another CVI technique using a temperature gradient has been described by J. J. Gebhardt et al. in an article entitled "Formation of carbon-carbon composite materials by pyrolytic infiltration", published in Petroleum derived carbons ACS Series No. 21 6/73.

In that case (FIG. 2), the substrate 20 to be densified is constituted by bundles of intermeshed graphite fibers oriented in seven different directions. The substrate is suspended inside an enclosure 24 with the gas being admitted through the base thereof. The graphite fibers conduct electricity sufficiently to enable the substrate to be heated by direct coupling with an induction winding 28 surrounding the enclosure.

The hottest zone of the substrate is situated inside the substrate, since its outside surface is cooled by radiation and by the upward flow of gas through the enclosure. A temperature gradient of a few °C. per centimeter is obtained going away from the internal portion which is the hottest.

In order to maintain a sufficient temperature gradient, the gas circulates at high speed so as to cool the surface, and the induction winding 28 is restricted to a few turns in order to heat a limited zone of the substrate, such that a temperature gradient is also established between the portion of the substrate situated in the induction field and the portion of the substrate lying outside the field. Densification of the entire substrate is obtained by moving the substrate within the enclosure, parallel to the axis of the winding. These constraints mean that the method can be of limited use only, since it is difficult to industrialize.

SUMMARY OF THE INVENTION

Thus, an object of the present invention is to provide a CVI method in which the substrate is heated by electromagnetic coupling, but without the drawbacks of the abovementioned methods, and in particular a method that can be used on an industrial scale for substrates that may be of great thickness.

According to the invention, this object is achieved by means of a method of the type in which the substrate is heated by direct induction, in which method:

the substrate is constituted by a fiber fabric in which the ratio $\pi_r/\pi_c$ of transversal electrical resistivity over longitudinal electrical resistivity is not less than 1.3, and the ratio $\lambda_r/\lambda_c$ of transversal thermal conductivity over longitudinal thermal conductivity is not less than 0.9; and the substrate is situated entirely within the field produced by the induction winding, the substrate and the induction winding occupying positions that are stationary relative to each other.

The term "transversal" applied to electrical resistivity or thermal conductivity is used to mean the resistivity or conductivity as measured perpendicularly to the outer side faces of the substrate, and in particular radial resistivity or conductivity for a substrate that is cylindrical. The term "longitudinal" is used with respect to electrical resistivity or thermal conductivity to mean resistivity or conductivity measured parallel to the outer side faces of the substrate, in particular circumferential resistivity or conductivity for a cylindrical substrate.

It has been established by the Applicant that a substrate having the above characteristics as to the ratios $\pi_r/\pi_c$ and $\lambda_r/\lambda_c$ is particularly suitable for being densified with heating by direct electromagnetic coupling. Its electrical resistivity and thermal conductivity are such that sufficient heating is produced by the direct coupling while simultaneously creating a temperature gradient of amplitude that is sufficiently great to make it possible to do without the artifice of incomplete coupling as described by Gebhardt et al.

One type of substrate that is particularly suitable for implementing the method of the invention, and that satisfies the above conditions, is constituted by a needled fibrous structure having a fiber volume ratio of at least 20%.

The fiber volume ratio in the substrate, i.e. the percentage of the apparent volume of the substrate that is indeed occupied by fibers, is preferably not less than 25%.

The use of needled fiber fabrics to constitute reinforcing fabrics for pieces made of composite material is well known. A method of making needled fabrics out of refractory fibers, and in particular carbon fibers, is described in patent applications FR-A-2 584 106 and FR-A-2 584 107. Such fabrics are built up of superposed two-dimensional plies, e.g. layers of cloth or sheets of threads that are stacked up flat, or turns of cloth wound on a mandrel. The plies are bonded together by needling. Needling is advantageously performed at constant density while the fabric is being built up.

Such needled fabrics are particularly suitable for making pieces of composite material. The bonding together of plies by needling makes it possible to withstand delamination, i.e. destruction or damage by the plies separating or by the plies sliding relative to one another. In addition, needling imparts pore sizes to the fiber fabric of dimension and distribution throughout the volume that are relatively uniform, which is favorable to densification.

The association of a substrate made of needled fiber fabric with heating by direct coupling can have numerous applications on an industrial scale whereas the prior art mentioned above relating to heating by electromagnetic coupling is more of an experimental technique.

Other features of the method of the invention appear on reading the following description given by way of non-limiting indication.

DESCRIPTION OF THE PREFERRED EMBODIMENTS

Figure 1:
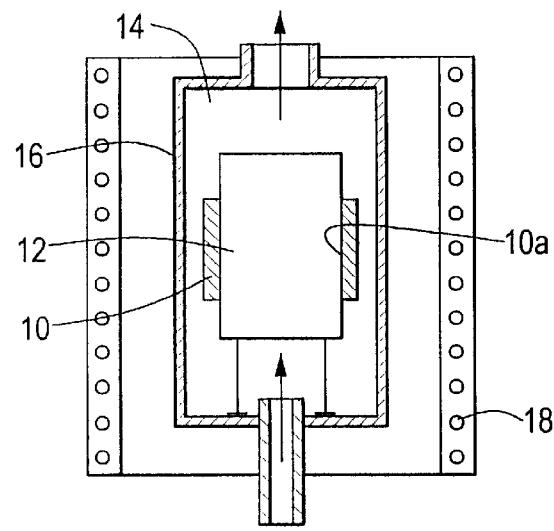
FIGS. 1 and 2 are described above, and show prior art chemical vapor infiltration installations in highly diagrammatic form, in which the substrate to be densified is heated by electromagnetic coupling.
Figure 2:
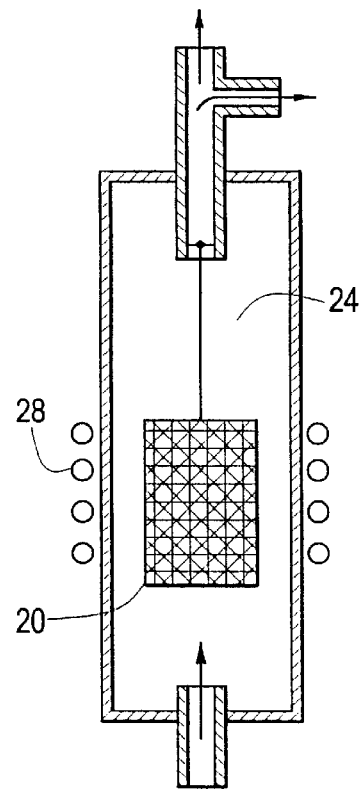
Figure 3:
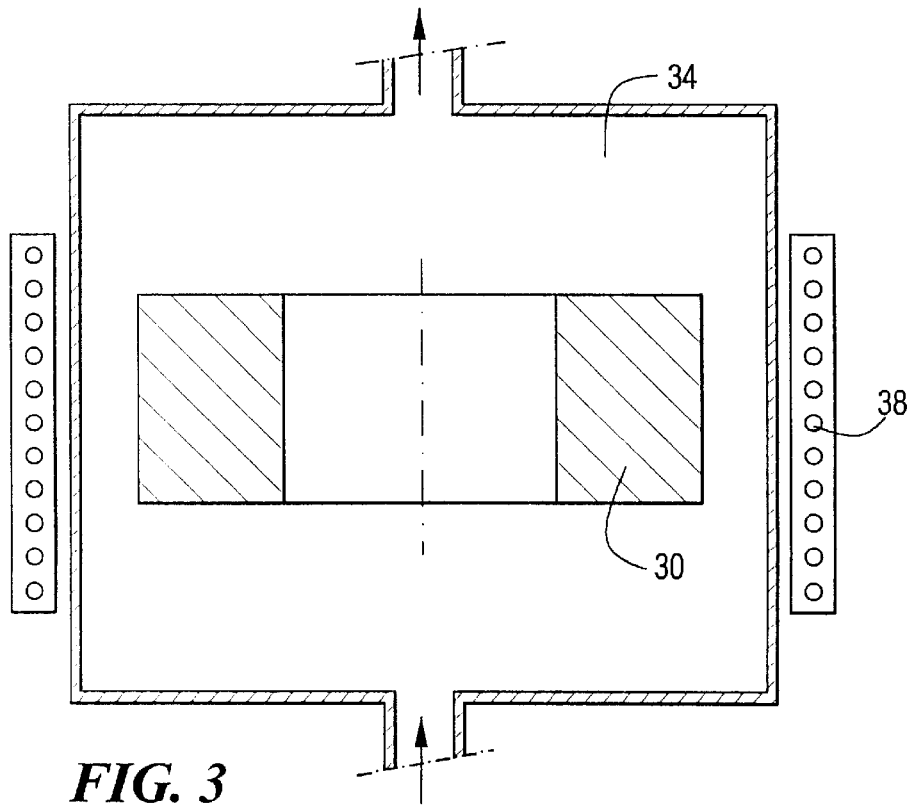
FIG. 3 shows in highly diagrammatic manner, an installation enabling the method of the invention to be implemented.

In the installation of FIG. 3, a substrate to be densified 30 is disposed inside an enclosure 34. In the example shown, the substrate is in the form of an annular cylinder having a rectangular meridional section. The substrate is heated by electromagnetic coupling by means of induction from a winding 38 surrounding the enclosure. The substrate 30 and the winding 38 are coaxial. The winding 38 extends axially over a length that is equal to or greater than the axial length of the substrate 30 so that the substrate lies entirely within the electromagnetic field generated by the winding.

The substrate is densified by chemical vapor infiltration (CVI) by admitting a reaction gas into the enclosure, with the composition of the gas being selected as a function of the kind of matrix that is to be deposited within the volume of the substrate. The gas is admitted to the bottom portion of the enclosure. The fraction of the gas that has not reacted together with any gaseous reaction products are extracted from the top portion of the enclosure which is connected to a vacuum source (not shown).

A CVI installation of the above type is described in European patent application EP-A-0 256 073. The installation of FIG. 3 for implementing the method of the invention differs from that known installation in that the substrate is heated by direct electromagnetic coupling between the winding and the substrate, and not indirectly by coupling between the winding and a graphite core situated at the periphery of the enclosure and serving to heat it.

The substrate 30 is made up of electrically conductive fibers, such as graphite or carbon fibers.

The substrate 30 has characteristics of electrical resistivity and of thermal conductivity that make it suitable for being heated to the desired temperature by direct coupling with the winding 38 while simultaneously presenting a significant temperature gradient between its hottest inner portion and its exposed outer surfaces. These characteristics are such that the ratio between its radial electrical resistivity $\pi_r$ and its circumferential electrical resistivity $\pi_c$ is not less than 1.3, while the ratio between its radial thermal conductivity $\lambda_r$ and its circumferential thermal conductivity $\lambda_c$ is not less than 0.9.

Its radial electrical resistivity preferably lies in the range 1 mΩ/cm to 20 mΩ/cm, while its radial thermal conductivity lies in the range 0.1 W/m. °K. to 20 W/m. °K.

One type of structure that is particularly suitable for the substrate 30 is a needled structure of graphite or carbon fibers. A method of manufacturing such a three-dimensional cylindrical structure by needling is described in above-mentioned document FR-A-2 584 107. That method consists in winding a two-dimensional fabric on a mandrel and needling while winding is taking place. By way of example, the two-dimensional fabric is constituted by a woven cloth. Winding and needling are performed using fabric fibers in a state that constitutes a precursor for carbon, e.g. in the pre-oxidized polyacrylonitrile state. Needling performed directly on carbon fibers would have an excessively destructive effect on the fabric (it would break its threads). Heat treatment is applied after the needled structure has been built up in order to transform the precursor into carbon. The treatment may be continued at higher temperatures, where appropriate, for the purpose of converting the fibers into graphite, at least to some extent.

The volume ratio of the fibers in the needled structure, i.e. the percentage of the apparent volume of the structure actually occupied by the fibers, is a function both of the fiber ratio in the wound basic two-dimensional fabric and of needling characteristics since needling has a compacting effect on superposed wound layers.

The volume ratio of the fibers in the needled structure should not be less than 20%, and is preferably not less than 25%, in order to satisfy the conditions relating to electrical resistivity and to thermal conductivity.

It is well known that a body is heated by induction because of the Joule effect due to induced currents, and that such currents are concentrated at the surface (skin effect). The greater the frequency of the current powering the induction winding, the more marked the phenomenon whereby heat is concentrated at the surface.

To optimize densification of the substrate by CVI, the objective is to establish a temperature gradient between a zone deep within the substrate and the surface thereof.

In spite of the skin effect, by selecting an appropriate frequency, and by taking account of the surface of the substrate being cooled by radiation and by convection (into the flow of gas), it is possible with a substrate having the above-specified characteristics to obtain a temperature gradient within the substrate.

Clearly the best frequency depends on several parameters: the nature of the fibers constituting the substrate, the thickness of the substrate, its electrical resistivity and thermal conductivity values, . . . .

As an indication, for a needled substrate made of carbon fibers obtained in the manner described above, the optimum frequency lies in the range about 150 Hz to about 3000 Hz, depending on the fiber volume ratio and on the thickness of the substrate.

In the example shown in FIG. 3, the substrate 30 is in the form of a right circular cylinder. The method of the invention can be implemented with substrates of other shapes, in particular cylindrical substrates that are not circular in section or non-cylindrical axially-symmetrical substrates, with the shape of the winding being adapted accordingly, where appropriate.

Two example implementations of the method of the invention are described below.

EXAMPLE 1

A fiber substrate in the form of an annular cylinder with an inside diameter of 90 mm and an outside diameter of 350 mm, and intended to constitute a reinforcing fabric or preform for a piece of composite material was made as follows.

A two-dimensional fabric made up of pre-oxidized polyacrylonitrile (PAN) fiber cloth was wound to build up superposed layers on a mandrel.

Each new layer was needled to the underlying fabric. For this purpose, a needle board was used extending axially over a distance of not less than the width of the plies, which width was equal to the height (100 mm) of the preform to be made. Needling was performed while winding was taking place, with each new layer being needled to a constant depth equal to the thickness of a plurality of needled layers. Once the preform had reached the desired thickness, 130 mm in this example, one or more finishing needling passes were performed in conventional manner to obtain a constant density of needling throughout the preform.

The weight per unit area of the cloth used lay in the range 100 g/m² to 600 g/m². Needling was performed at a density suitable for achieving a fiber volume ratio in the preform equal to 28%, after heat treatment had been applied to transform the pre-oxidized PAN into carbon.

Such a fabric has radial electrical resistivity $\pi_r$ estimated at 13 mΩ/cm, and circumferential electrical resistivity $\pi_c$ equal to 7 mΩ/cm, giving a ratio $\pi_r/\pi_c$ equal to 1.85, and having radial thermal conductivity $\lambda_r$ estimated at 0.25 W/m. °K. and circumferential thermal conductivity $\lambda_c$=0.5 W/m. °K., giving a ratio $\lambda_r/\lambda_c$=0.50.

The preform was placed in the enclosure 34 and was heated by powering the winding 38 at a frequency of 1800 Hz. A temperature field was established within the preform as a result both of heat sources generated by the induced currents due to electromagnetic coupling and heat losses from the outer surface of the preform. Heat losses took place by convection as the gas swept through, and also by radiation. The gas admitted into the enclosure was constituted by methane which gave rise to a pyrolytic carbon matrix on decomposing.

Figure 4:
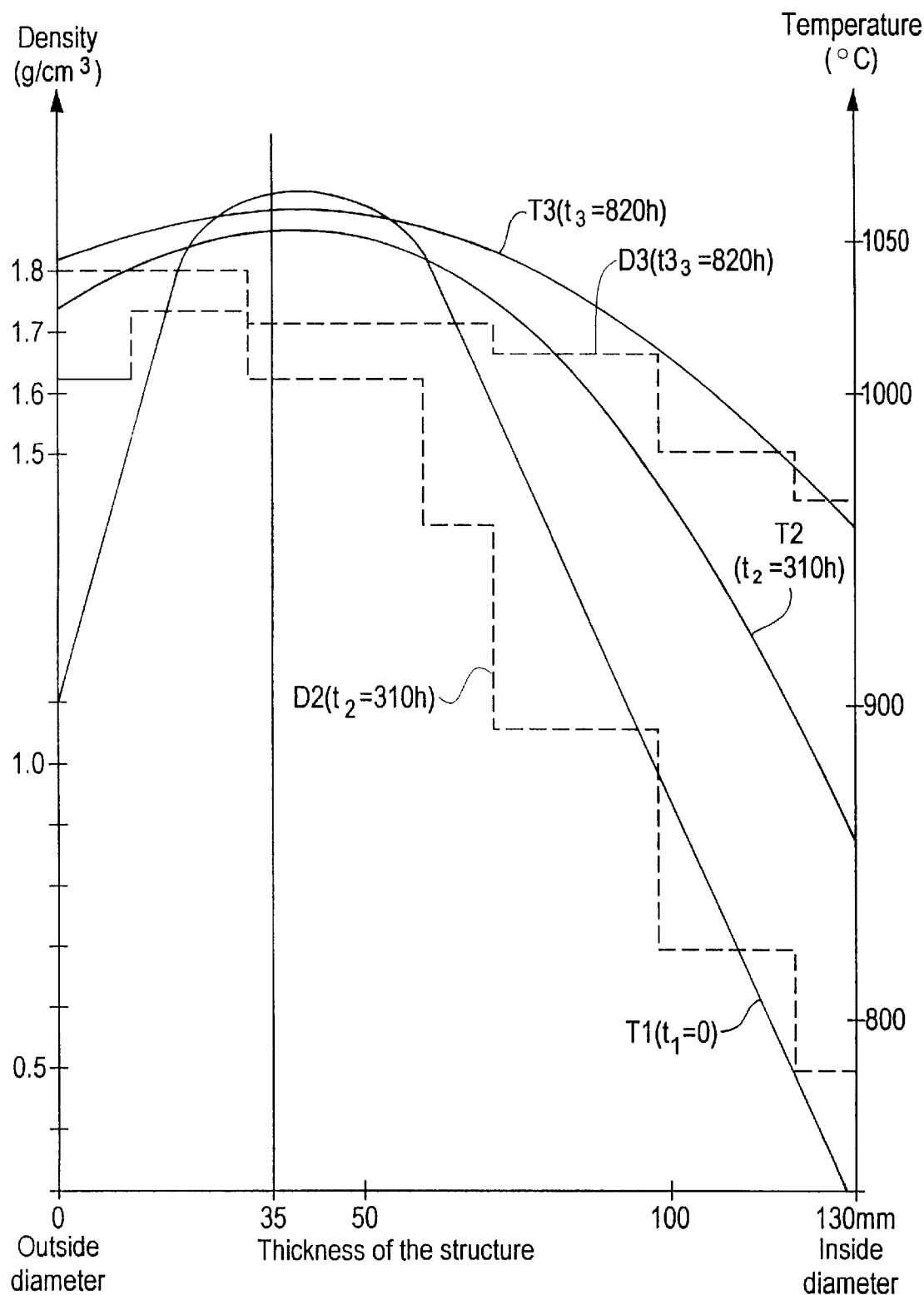
FIG. 4 is a graph showing the temperature gradient and the density gradient in a cylindrical piece densified by a method of the invention.

The temperature distribution within the thickness of the preform (in the radial direction) was measured at the beginning of densification (time $t_1$=0), after densification had been performed partially (time $t_2$=310 h) and at the end of densification (time $t_3$=820 h). Curves T1, T2, and T3 in FIG. 4 show the respective temperature gradients at times $t_1$, $t_2$, and $t_3$.

The distribution of density across the thickness of the preform (in the radial direction) was also measured at times $t_2$ and $t_3$. Curves $D_2$ and $D_3$ in FIG. 4 show the respective density gradients at times $t_2$ and $t_3$. Density measurements were performed by taking samples from the middle portion of the densified preform.

A maximum temperature was achieved in a zone situated at about 35 mm from the outer surface of the preform, and this continued throughout the densification process. Carbon matrix densification gave rise to progressive variation in the radial and circumferential values of electrical resistivity and of thermal conductivity. At the end of the densification process, the ratio $\pi_r/\pi_c$ had reached the value 1.85 while the ratio $\lambda_r/\lambda_c$ had reached the value 0.80. Clearly, carbon matrix densification gives rise to a progressive increase in radial thermal conductivity and correspondingly to a decrease in thermal gradient.

At the end of densification, at time $t_3$, the resulting piece had a mean density of 1.72 g/cm³, with a core density of 1.73 g/cm³. The method thus made it possible to achieve densification that was almost uniform, and without requiring any intermediate machining operation.

EXAMPLE 2

An annular cylindrical preform having an outside diameter of 1100 mm, a thickness of 125 mm, and a height of 400 mm was made by winding and needling cloth, as in Example 1. The preform was intended for manufacturing the nozzle throat of a thruster.

After the preform fibers had been carbonized, the preform was placed in an enclosure of a densification installation of the kind shown in FIG. 3. The preform was heated by direct electromagnetic coupling using the winding, which was powered at a frequency of 150 Hz. The frequency was lower than that used in Example 1 because the volume of the preform was greater.

The preform was densified by admitting into the enclosure a gas essentially constituted by methane, giving rise to a matrix of pyrolytic carbon.

After 920 hours of densification, the density reached was equal to 1.62 g/cm³ and there was no need for intermediate machining. At this stage, it was possible to machine the outer profiles of the throat and perform surface treatment to make the piece gastight, after which the piece was ready for use.

We claim:

1. A CVI method of infiltrating a material into a fibrous substrate including electrically conductive fibers, the method comprising the following steps:

placing the substrate in an enclosure;

heating the substrate only by direct electromagnetic coupling between the substrate and an induction winding, without indirect heating of said substrate caused by electromagnetic coupling between a core in said enclosure and said inactive winding, to enable a temperature gradient to be established within the substrate such that the substrate has a temperature that is greater in its portions furthest from its outer surfaces than in a vicinity of its outer surfaces; and admitting a reaction gas into the enclosure which gas is a precursor for a material to be infiltrated, with formation of said material being enhanced in portions of the substrate that are at higher temperature;

the method being characterized in that:

the substrate is constituted by a fiber fabric having a ratio $\pi_r/\pi_c$ of transversal electrical resistivity to longitudinal electrical resistivity of not less than 1.3, and having a ratio $\lambda_r/\lambda_c$ of transversal thermal conductivity of not less than 0.9; and the substrate is situated entirely within a field produced by the induction winding, the substrate and the induction winding occupying positions that are stationary relative to each other.

2. A method according to claim 1, characterized in that the substrate is constituted by a needled fibrous structure having a fiber volume ratio of not less than 20%.

3. A method according to claim 2, characterized in that the substrate has a fiber volume ratio of not less than 25%.

4. A method according to claim 3, characterized in that:

the substrate is constituted by a two-dimensional fabric wound in superposed layers that are needled together;

the transversal electrical resistivity of the fiber fabric constituting the substrate lies in the range of 1 mΩ/cm to 20 mΩ/cm;

the transversal thermal conductivity of the fiber fabric constituting the substrate lies in the range 0.1 W/m. °K. to 20 W/m. °K.

5. A method according claim 1, characterized in that the substrate is constituted by a two-dimensional fabric wound in superposed layers that are needled together.

6. A method according to claim 1, characterized in that the transversal electrical resistivity of the fiber fabric constituting the substrate lies in the range 1 mΩ/cm to 20 mΩ/cm.

7. A method according to claim 1, characterized in that the transversal thermal conductivity of the fiber fabric constituting the substrate lies in the range 0.1 W/m. °K. to 20 W/m. °K.

* * * * *

UNITED STATES PATENT AND TRADEMARK OFFICE
CERTIFICATE OF CORRECTION

PATENT NO. : 5,846,611
DATED : December 8, 1998
INVENTOR(S) : Francois Christin

It is certified that error appears in the above-indentified patent and that said Letters Patent is hereby corrected as shown below:

Column 3, line 67 reads, "$\pi_r/\pi_c$" should read --$\rho_r/\rho_c$--.

Column 4, line 20 reads, "$\pi_r/\pi_c$" should read --$\rho_r/\rho_c$--.

Column 5, line 46 reads, "$\pi_r$" should read --$\rho_r$--.

Column 5, line 47 reads, "$\pi_c$" should read --$\rho_c$--.

Column 7, line 9 reads, "$\pi_r$" should read --$\rho_r$--.

Column 7, line 10 reads, "$\pi_c$" should read --$\rho_c$--.

Column 7, line 11 reads, "$\pi_r/\pi_c$" should read --$\rho_r/\rho_c$--.

Column 7, line 45 reads, "$\pi_r/\pi_c$" should read --$\rho_r/\rho_c$--.

Column 8 (claim 1), line 22 reads, "inactive" should read "induction".

Column 8 (claim 1), line 33 reads, "$\pi_r/\pi_c$" should read --$\rho_r/\rho_c$--.

Signed and Sealed this

Twentieth Day of March, 2001

Attest:

NICHOLAS P. GODICI

*Attesting Officer*      *Acting Director of the United States Patent and Trademark Office*